United States Patent
Ono et al.

(10) Patent No.: US 8,734,573 B2
(45) Date of Patent: May 27, 2014

(54) VENT PLUG

(75) Inventors: Masashi Ono, Tokyo (JP); Hiroshi Manabe, Tokyo (JP)

(73) Assignee: W. L. Gore & Associates, Co., Ltd., Tokyo (JP)

( * ) Notice: Subject to any disclaimer, the term of this patent is extended or adjusted under 35 U.S.C. 154(b) by 261 days.

(21) Appl. No.: 13/384,125

(22) PCT Filed: Jul. 14, 2010

(86) PCT No.: PCT/JP2010/061893
§ 371 (c)(1),
(2), (4) Date: Mar. 9, 2012

(87) PCT Pub. No.: WO2011/007799
PCT Pub. Date: Jan. 20, 2011

(65) Prior Publication Data
US 2012/0174789 A1   Jul. 12, 2012

(30) Foreign Application Priority Data
Jul. 15, 2009   (JP) .................................. 2009-167138

(51) Int. Cl.
*B01D 53/22* (2006.01)
*B01D 69/10* (2006.01)
*B01D 71/36* (2006.01)

(52) U.S. Cl.
USPC ............. 96/4; 96/11; 95/47; 95/54; 55/385.3; 55/385.4

(58) Field of Classification Search
USPC ........ 96/4, 6, 11; 95/45, 46, 47, 54; 55/385.4, 55/385.6, 385.3
See application file for complete search history.

(56) References Cited

U.S. PATENT DOCUMENTS

| | | | | |
|---|---|---|---|---|
| 4,159,954 | A * | 7/1979 | Gangemi | 210/446 |
| 5,522,769 | A * | 6/1996 | DeGuiseppi | 96/6 |
| 6,464,425 | B1 * | 10/2002 | Closkey | 96/4 |
| 7,156,890 | B1 * | 1/2007 | Thompson et al. | 96/4 |
| 7,201,287 | B2 * | 4/2007 | Maenke | 220/203.11 |
| 7,579,105 | B2 * | 8/2009 | Yoppolo et al. | 429/56 |
| 8,475,575 | B2 * | 7/2013 | Ono et al. | 96/4 |
| 2002/0090506 | A1 * | 7/2002 | Protzner et al. | 428/334 |
| 2003/0216119 | A1 * | 11/2003 | Mashiko et al. | 454/275 |
| 2009/0266815 | A1 * | 10/2009 | Lauk et al. | 220/89.1 |

FOREIGN PATENT DOCUMENTS

| | | |
|---|---|---|
| CN | 1459392 | 12/2003 |
| DE | 102006062044 | 4/2008 |
| EP | 1202616 | 5/2002 |
| EP | 1363484 | 11/2003 |
| JP | 2004-266211 | 9/2004 |
| JP | 2005-243829 | 9/2005 |
| JP | 2006-315725 | 11/2006 |
| JP | 2006315725 | 11/2006 |
| JP | 2008-148388 | 6/2008 |
| JP | 2008148388 | 6/2008 |

* cited by examiner

*Primary Examiner* — Jason M Greene
(74) *Attorney, Agent, or Firm* — Amy L. Miller

(57) ABSTRACT

An object is to provide a vent plug having a structure in which an air-permeable membrane is unlikely to be damaged. More specifically, a vent plug is produced, which includes: a cylindrical member 1 having a through-hole 1a; a support 2 connected to the cylindrical member 1 so as to be across the through-hole 1a; and an air-permeable membrane 3 circumferentially attached to the cylindrical member 1, wherein the air-permeable membrane 3 is held on the support 2 and a convex portion 3a that follows the shape of the support 2 is formed on the air-permeable membrane 3.

20 Claims, 8 Drawing Sheets

(a)

(b)

(c)

(a)

(b)

(a)

(b)

(a)

(b)

(c)

VENT PLUG

TECHNICAL FIELD

The present invention relates to a vent plug with an air-permeable membrane that has the function of blocking liquid, such as water droplets and oil droplets, while allowing gas to pass therethrough.

BACKGROUND ART

Electric devices, such as headlamps, tail lamps, fog lamps, power windows, pressure sensors, pressure switches, and engine control units of automobiles, are used in an environment in which they are exposed to liquid, such as water, oil, and surfactants. Furthermore, also among general home appliances, electric razors, mobile phones, electric toothbrushes, and others are used in an environment in which they are exposed to liquid, such as water, oil, and surfactants. In these electric devices, a case for putting electronic components therein needs to be highly droplet-proof. If, however, the case is completely airtight, the expansion and contraction of gas in the case due to temperature changes causes a difference in pressure between the inside and outside of the case, and excessively encumbers the case. Accordingly, the case needs to remain capable of allowing gas to enter and exit from it, while preventing liquid from entering.

Patent Document 1 describes a vent cap including: a cover component having a cylindrical shape with a bottom; and a cylindrical body fitting within the cover component. A labyrinthine vent passage is formed between the inner periphery of the cover component and the outer periphery of the cylindrical body, and also between the bottom surface of the cover component and the bottom portion of the cylindrical body, whereby the vent cap exhibits waterproofness and air permeability.

Patent Document 2 describes a ventable plug that is attached to a case of an electric motor for an automotive power window. In a sheet joining portion of this cylindrical plug body, an air-permeable sheet is formed so as to close the inside of the plug body, whereby water is prevented from entering the motor case, and the function of the air-permeable membrane allows ventilation between the inside and outside of the case.

Patent Document 3 describes a motor having a breathing hole, to a cylindrical portion of which an attachment member is fit so as to be attachable thereto and detachable therefrom, the attachment member obtained by forming, in an attachment body, partially protruding blockage prevention protrusions on an edge surface around an opening at one end of the attachment body formed of an elastic member such as a rubber material; and fixing a waterproof sheet so as to cover the opening of the attachment body. The attachment member can prevent water such as rainwater from entering the breathing hole. Further, the presence of the protrusions prevents an opening portion of the breathing hole from being blocked by contact with the surface of another member.

PRIOR ART DOCUMENTS

Patent Documents

Patent Document 1: Japanese Patent Laid-open Publication No. 2001-143524 (FIG. 1)
Patent Document 2: Japanese Patent Laid-open Publication No. 2003-63549 (FIGS. 1 and 2)
Patent Document 3: Japanese Patent Laid-open Publication No. 2008-148388 (FIGS. 4 and 5)

DISCLOSURE OF THE INVENTION

Problems to be Solved by the Invention

In the case of using a conventional vent cap (vent plug) described above, however, when the vent plug is handled, for example, when the vent plug is attached to a motor case, the hands and fingers of a worker, an attaching device, or others (hereinafter referred to as the "hands and fingers or others") may make contact with an air-permeable membrane, and therefore, the air-permeable membrane may be damaged. In view of such circumstances, it is an object of the present invention to provide a vent plug having a structure in which an air-permeable membrane is not damaged even by some contact, or a structure in which, even if somewhat damaged, the air-permeable membrane prevents liquid or gas leakage.

Means of Solving the Problems

The vent plug of the present invention, which can achieve the above object, comprises: a cylindrical member having a through-hole; a support connected to the cylindrical member so as to be across the through-hole; and an air-permeable membrane attached around the cylindrical member, wherein the air-permeable member is held on the support and a convex portion that follows the shape of the support is formed on the air-permeable membrane.

In the above vent plug, the cylindrical member and the support may desirably be integrally formed together from the same material.

In the above vent plug, an embodiment can be applied, in which the support has a branched structure and is connected to three or more positions of the cylindrical member.

In the above vent plug, an embodiment can be applied, in which the support has a cross structure and is connected to four or more positions of the cylindrical member.

In the above vent plug, an embodiment may desirably be applied, in which the support has a mesh structure.

In the above vent plug, an embodiment may desirably be applied, in which the support has an arc shape.

In the above vent plug, an embodiment may preferably be applied, in which the cylindrical member has a protrusion at a portion to which the air-permeable membrane is circumferentially attached. Further, the top of the protrusion may more preferably be at a position higher than the top of the convex portion of the air-permeable membrane.

In the above vent plug, an embodiment can be applied, in which the support is not completely across the through-hole but interrupted.

In the above vent plug, an embodiment can be applied, in which the support has a protrusion.

In the above vent plug, the air-permeable membrane may preferably be a porous polytetrafluoroethylene membrane.

In the above vent plug, the air-permeable membrane may preferably have liquid repellency.

Effects of the Invention

The vent plug of the present invention has a support and an air-permeable membrane held by the support, and a convex portion that follows the shape of the support is formed on the air-permeable membrane. Thus, the vent plug has the excellent effects: even if hands and fingers or others make contact with the air-permeable membrane when the vent plug is attached to a motor case, the air-permeable membrane is unlikely to be damaged; and further, even if somewhat damaged, the air-permeable membrane makes liquid or gas leakage unlikely to occur.

MODE FOR CARRYING OUT THE INVENTION

1. Structure of Vent Plug

Figure 1:
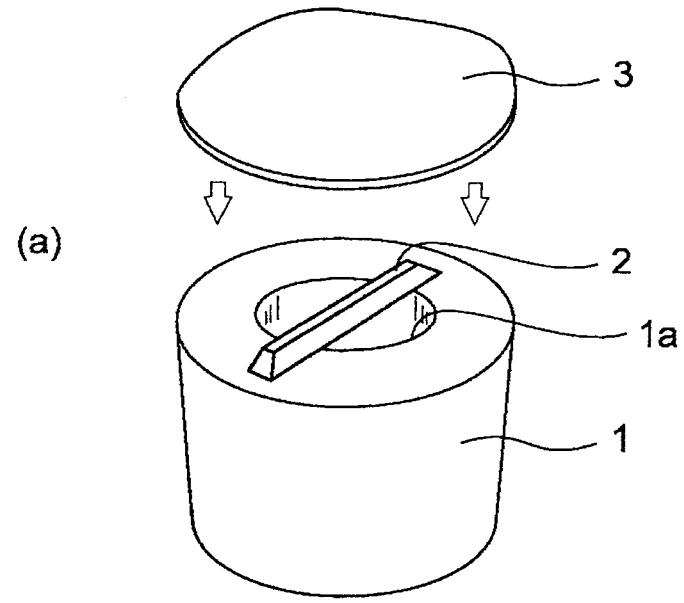
[FIG. 1] (a) is an exploded view of a vent plug according to Embodiment 1 of the present invention; (b) is a perspective view of the completed vent plug; and (c) is a cross-sectional view of the vent plug.
Figure 1:
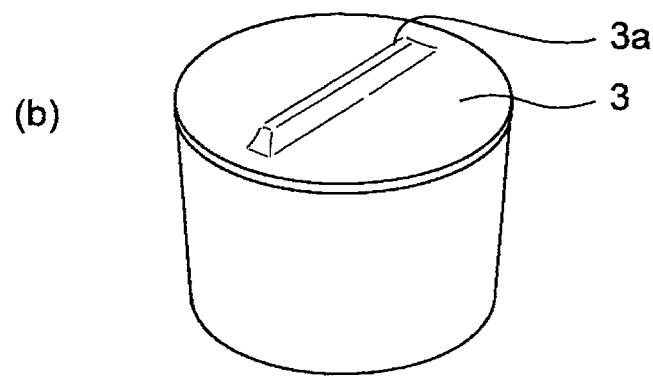
Figure 1:
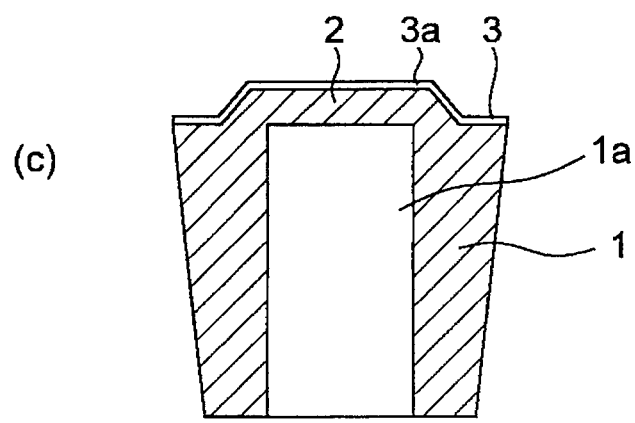

The structures of vent plugs according to embodiments of the present invention will be described below by reference to the drawings.

(Embodiment 1)

FIG. 1(a) to (c) show a vent plug according to Embodiment 1 of the present invention: (a) is an exploded view of the vent plug for understanding the internal structure thereof; (b) is a perspective view of the completed vent plug; and (c) is a cross-sectional view of the vent plug. FIG. 1(a) is merely an exploded view as described above, and therefore, the step of attaching an air-permeable membrane 3 to a cylindrical member 1 is not limited to such a form. In this connection, the air-permeable membrane 3 is drawn so as to be thicker than the one actually used.

In FIG. 1(a) to (c), the cylindrical member 1 having a through-hole 1a is connected to a support 2 so as to be across the through-hole 1a. Further, the air-permeable membrane 3 is attached so as to cover the cylindrical member 1 and the support 2. As shown in FIG. 1(a) to (c), particularly in (c), the air-permeable membrane 3 is held by the support 2, and the air-permeable membrane 3 has a convex portion 3a that follows the shape of the support 2.

The portion of the air-permeable membrane 3, which portion is in circumferential contact with the cylindrical member 1, is referred to as the "circumferential attachment region." Further, the portion that is not in contact with the cylindrical member 1 but faces the through-hole 1a allows ventilation through the through-hole 1a, and therefore, this portion is referred to as the "ventilation region." In this connection, unless otherwise indicated, the portion of the air-permeable membrane 3 that is held by the support 2 is also referred to as the "ventilation region" for convenience.

In the ventilation region of the air-permeable membrane 3, the convex portion 3a is formed that follows the shape of the support 2 as described above. Therefore, when hands and fingers or others approach from above the ventilation region, the hands and fingers or others have high probability of first making contact with the convex portion 3a, which is slightly higher in the ventilation region. Even if the hands and fingers or others make contact with the convex portion 3a, the support 2 is provided on the opposite side of the convex portion 3a, and therefore, the support 2 serves as a cushion. Thus, even if the hands and fingers or others make contact with the air-permeable membrane 3, the air-permeable membrane 3 is unlikely to be damaged. Further, even if the air-permeable membrane 3 has become damaged, the presence of the support 2 minimizes liquid or gas leakage.

To explain it more fully, in the vent plug according to Embodiment 1, the portion of the ventilation region of the air-permeable membrane 3, with which the hands and fingers or others have high probability of first making contact, is the convex portion 3a, which is formed so as to be relatively high as compared to the surrounding portion. Accordingly, when the hands and fingers or others approach the vent plug, the hands and fingers or others make contact preferentially with the convex portion 3a. This makes it possible to relatively reduce the probability of the hands and fingers or others making contact with the portion in which the support 2 is not formed. This reduces the probability of the hands and fingers or others damaging the air-permeable membrane 3. Further, even if the air-permeable membrane 3 has become damaged, the presence of the support 2 reduces the probability of liquid or gas leakage.

In this connection, as shown in FIG. 1, if the support 2 is formed such that the width of the support 2 increases toward the cylindrical member 1, that is, if the support 2 is formed in a trapezoidal shape, this facilitates firm contact between the air-permeable membrane 3 and the lateral surfaces of the support 2. This facilitates the formation of the convex portion 3a on the air-permeable membrane 3, and therefore, it is a preferred embodiment.

In addition, although this is not an essential requirement of the present invention, it is desirable that as in the vent plug according to Embodiment 1, an outer peripheral portion of the circumferential attachment region of the air-permeable membrane 3 should be in contact with a lateral surface portion of the cylindrical member 1. This is because it is possible to guide droplets accumulated on the air-permeable membrane 3 smoothly to a lateral surface portion of the vent plug.

The vent plug according to Embodiment 1 of the present invention is used, for example, for a storage case of an electric device, the case needing to be both air-permeable and droplet-proof. In the storage case, for example, a circular hole is bored, and the vent plug is attached so as to be inserted into the hole. As shown in FIG. 1, if the lateral surface of the cylindrical member 1 of the vent plug has a tapered shape, it is possible to securely insert the vent plug into the hole.

(Embodiment 2)

Figure 2:
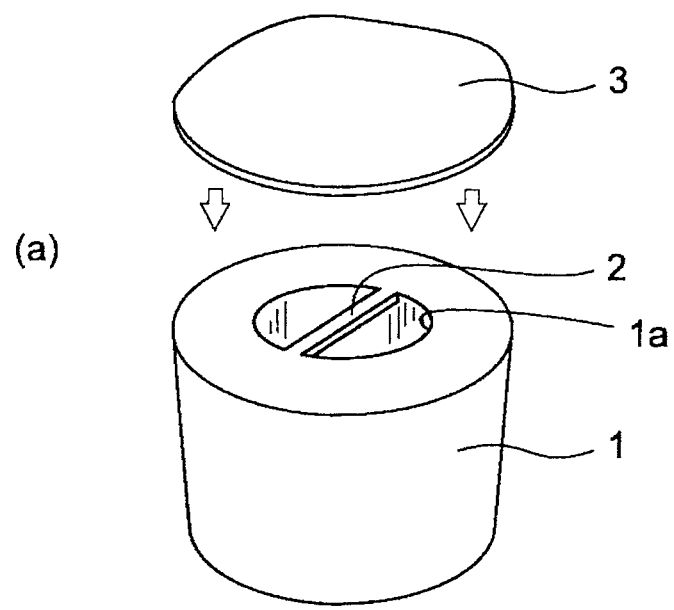
[FIG. 2] (a) is an exploded view of a vent plug according to Embodiment 2 of the present invention; and (b) is a perspective view of the completed vent plug.
Figure 2:
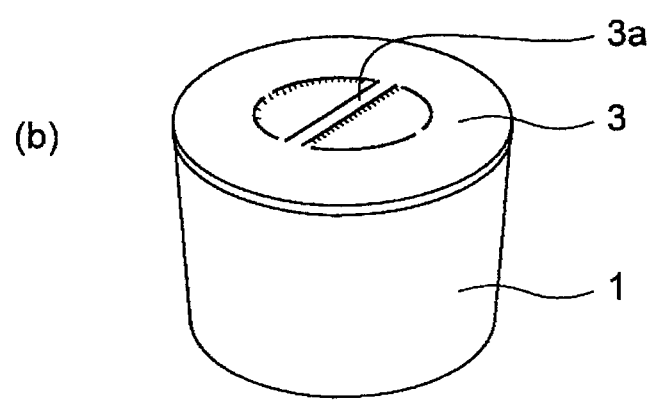

FIG. 2(a) and (b) show a vent plug according to Embodiment 2 of the present invention: (a) is an exploded view of the vent plug for understanding the internal structure thereof; and (b) is a perspective view of the completed vent plug. The vent plug according to Embodiment 2 is basically similar to the vent plug according to Embodiment 1. In Embodiment 1, however, the form is such that the support 2 is mounted on the cylindrical member 1 of the vent plug, whereas, in Embodiment 2, the support 2 is formed within the through-hole 1a of the cylindrical member 1, and the support 2 is not present at a position higher than the upper surface of the cylindrical member 1. Even in such a form, the air-permeable membrane 3 bends due, for example, to flexure in the portion of the ventilation region of the air-permeable membrane 3, in which portion the support 2 is not present. Thus, the convex portion 3a is formed that follows along the shape of the support 2 in the portion in which the support 2 is present. This reduces, as described in Embodiment 1, the probability of the hands and fingers or others damaging the air-permeable membrane 3.

In Embodiment 2, the support 2 is not formed at a position higher than the upper surface of the cylindrical member 1, while the effect of the vent plug according to Embodiment 1 is attained. Thus, the probability per se of the hands and fingers or others making contact with the air-permeable membrane 3 is lower than that in the case of Embodiment 1.

Meanwhile, in Embodiments 1 and 2, there were explained by way of figures the cases where one support 2 was formed. Alternatively, if two or more supports 2 are formed, it is possible to further reduce the probability of the air-permeable membrane 3 being damaged.

(Embodiment 3)

Figure 3:
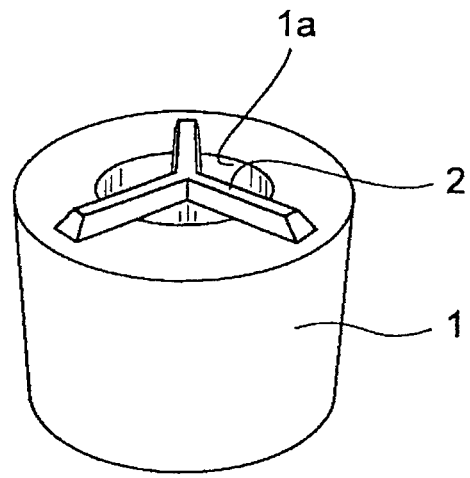
[FIG. 3] This is a perspective view of a vent plug according to Embodiment 3 of the present invention.

FIG. 3 is a perspective view of a vent plug according to Embodiment 3 of the present invention. In the vent plug according to Embodiment 3, the support 2 has a branched structure, and end portions of the support 2 are each connected to the cylindrical member 1. To reduce over a wide range the probability of the air-permeable membrane 3 being damaged, a method may possibly be performed of forming a plurality of rod-like supports 2 as described above. However, when the number of supports 2 is simply increased, the contact between the ventilation region of the air-permeable membrane 3 and the supports 2 may reduce the ventilation efficiency (increase the pressure loss). In contrast, if the support 2 has a branched structure as in the vent plug according to Embodiment 3, the support 2 can be placed at a required portion. This makes it possible to efficiently reduce over a wide range the probability of the air-permeable membrane 3 being damaged, while maintaining a low pressure loss in the air-permeable membrane 3.

(Embodiment 4)

Figure 4:
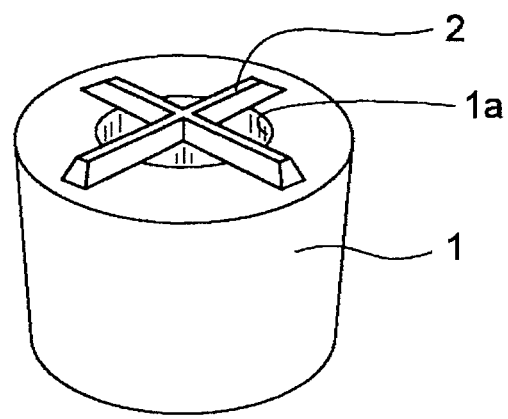
[FIG. 4] This is a perspective view of a vent plug according to Embodiment 4 of the present invention.

FIG. 4 is a perspective view of a vent plug according to Embodiment 4 of the present invention. In the vent plug according to Embodiment 4, the support 2 has a cross structure, and is connected to four positions of the cylindrical member 1. Similarly to the vent plug according to Embodiment 3, it is possible to efficiently reduce over a wide range the probability of the air-permeable membrane 3 being damaged, without significantly increasing the pressure loss in the air-permeable membrane 3.

(Embodiment 5)

Figure 5:
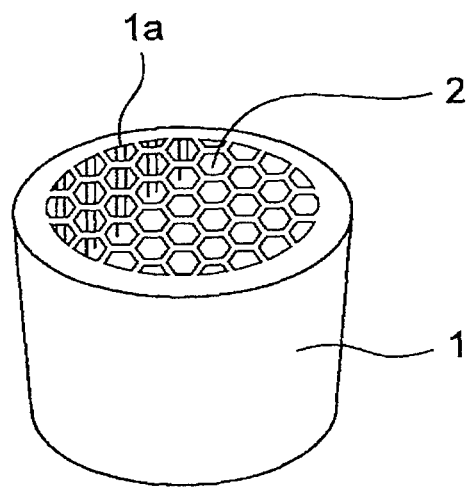
[FIG. 5] This is a perspective view of a vent plug according to Embodiment 5 of the present invention.

FIG. 5 is a perspective view of a vent plug according to Embodiment 5 of the present invention. In the vent plug according to Embodiment 5, the support 2 has a mesh structure. Similarly to the vent plug according to Embodiment 3 or 4, it is possible to efficiently reduce over a wide range the probability of the air-permeable membrane 3 being damaged, without significantly increasing the pressure loss in the air-permeable membrane 3. Particularly, the support 2 shown in FIG. 5 has, among mesh structures, a honeycombed shape termed a honeycomb structure, and therefore, it can achieve high strength. Thus, the support 2 has certain rigidity against an external stress by hands and fingers or others, and also has resistance to the deformation force of, for example, the contraction of the air-permeable membrane 3.

Applicable examples of each shape of meshes may include, as well as the hexagon shown in FIG. 5, squares, rectangles, rhombuses, parallelograms, trapezoids, triangles, and other polygonal shapes. As a matter of course, shapes including curves, such as circles and ellipses, can also be applied as well as the above.

(Embodiment 6)

Figure 6:
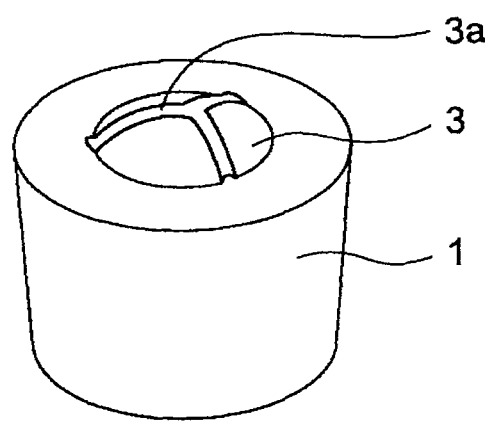
[FIG. 6] This is a perspective view of a vent plug according to Embodiment 6 of the present invention.

FIG. 6 is a perspective view of a vent plug according to Embodiment 6 of the present invention. In the vent plug according to Embodiment 6, the support 2 has an arc shape. In this case, the ventilation region of the air-permeable membrane 3 can be formed into a dome-like shape. This makes it possible to increase the area of the ventilation region as compared to the case where the ventilation region has a planar shape, even if the cylindrical member 1 of the same shape is used. Accordingly, it is possible to reduce an increase in the pressure loss in the air-permeable membrane 3 due to the provision of the support 2. Further, it is also possible to provide a vent plug having a lower pressure loss by offsetting the entire increase in the pressure loss. In addition, the expansion of the ventilation region also provides the effect of preventing the accumulation of liquid in the ventilation region.

(Embodiment 7)

Figure 7:
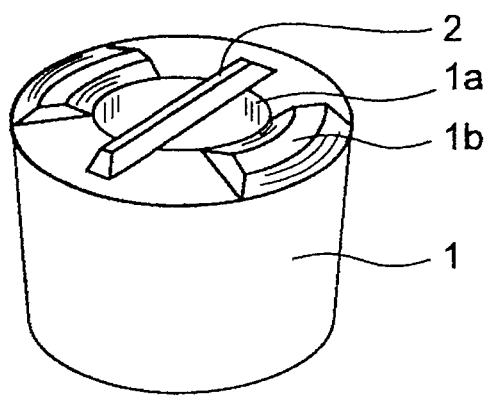
[FIG. 7] This is a perspective view of a vent plug according to Embodiment 7 of the present invention.

FIG. 7 is a perspective view of a vent plug according to Embodiment 7 of the present invention. In this regard, however, to understand the shapes, the perspective view shows the vent plug in which the air-permeable membrane 3 is not formed. The vent plug according to Embodiment 7 is similar in basic structure to the vent plug according to Embodiment 1. In the vent plug according to Embodiment 7, however, protrusions 1b are formed on the cylindrical member 1 in the circumferential attachment region of the air-permeable membrane 3. The protrusions 1b serve as protective dikes when hands and fingers or others approach the vent plug, and therefore, they prevent the hands and fingers or others from making direct contact with the air-permeable membrane 3. This makes it possible to reduce the probability of the air-permeable membrane 3 being damaged. In this connection, the protrusions 1b may be integrally formed together as parts of the cylindrical member 1, or may be separate components added to the cylindrical member 1.

The air-permeable membrane 3 is formed so as to cover the protrusions 1b in the circumferential attachment region, and has a shape that follows the surface shapes of the protrusions 1b. Accordingly, droplets present in the ventilation region of the air-permeable membrane 3 can move on the air-permeable membrane 3 smoothly from the ventilation region to the circumferential attachment region without being blocked by the protrusions 1b. This makes the droplets unlikely to accumulate within the vent plug, and therefore, this makes it possible to retain the area of the portion of the ventilation region in which droplets are not accumulated, that is, the effective opening area of the ventilation region, even in a harsh usage environment such as outdoors and in an engine room, and to maintain air permeability.

Meanwhile, if the vent plug is produced such that the top of each of the protrusions 1b is at a position higher than the top of the convex portion 3a of the air-permeable membrane 3, hands and fingers or others, when approaching the vent plug, have high probability of making contact with the protrusions 1b of the cylindrical member 1 before making contact with the convex portion 3a of the air-permeable membrane 3. This is more preferable in view of preventing the air-permeable membrane 3 from being damaged. More specifically, the top of each of the protrusions 1b may desirably be set from 0.5 to 5 mm higher than the top of the convex portion 3a.

(Embodiment 8)

Figure 8:
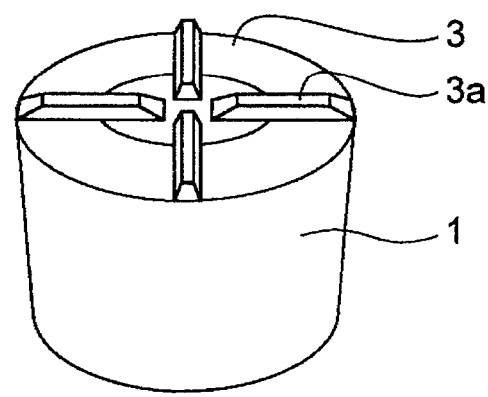
[FIG. 8] This is a perspective view of a vent plug according to Embodiment 8 of the present invention.

FIG. 8 is a perspective view of a vent plug according to Embodiment 8 of the present invention. In the vent plug according to Embodiment 8, the support 2 is interrupted in the middle without being completely across the through-hole 1a. The support 2 is required to be securely fixed to the cylindrical member 1; however, such a structure makes it possible to maintain a low pressure loss in the vent plug by not providing the support 2 in a portion that serves an important role in the ventilation, such as a central portion of the air-permeable membrane 3.

(Embodiment 9)

Figure 9:
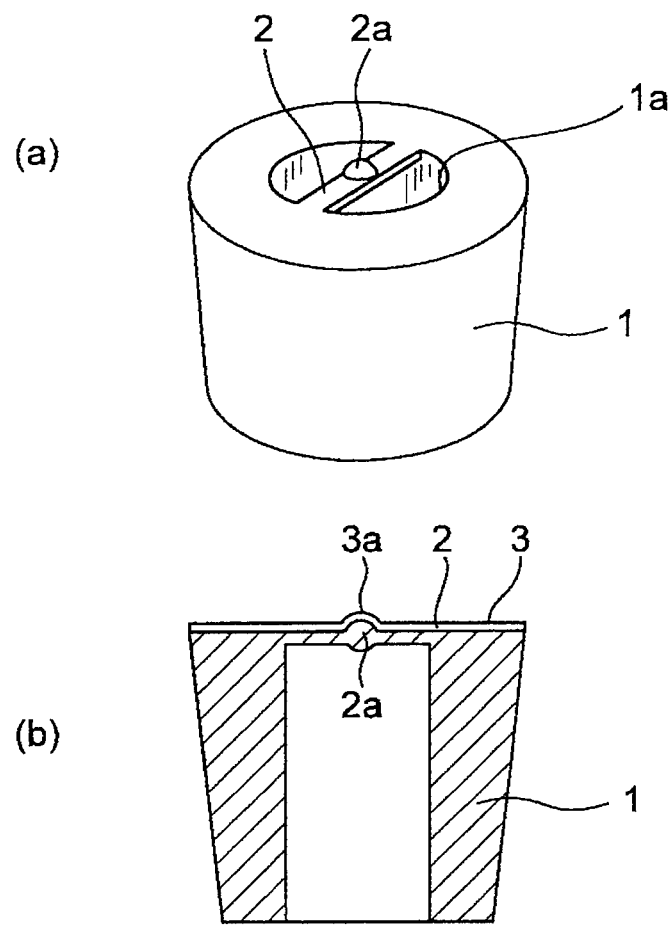
[FIG. 9] (a) is a perspective view of a vent plug according to Embodiment 9 of the present invention; and (b) is a cross-sectional view including a support 2.

FIG. 9(a) is a perspective view of a vent plug according to Embodiment 9 of the present invention. In this regard, however, to understand the shapes, the perspective view shows the vent plug in which the air-permeable membrane 3 is not formed. FIG. 9(b) is a cross-sectional view including the support 2, and the cross-sectional view shows the vent plug in which the air-permeable membrane 3 is formed.

The vent plug according to Embodiment 9 is, as shown in FIGS. 9(a) and (b), similar in basic structure to the vent plug according to Embodiment 2, but is different from the vent plug according to Embodiment 2 in that in the vent plug according to Embodiment 9, a protrusion 2a is provided on the support 2.

The provision of the protrusion 2a on the support 2 leads to the provision of a portion higher in the convex portion 3a that follows the shape of the support 2. This makes it possible to define in advance a position with which hands and fingers or others have high probability of making contact, determinately at a position of the protrusion 2a. The position at which the protrusion 2a is provided may preferably be a central portion of the ventilation region of the air-permeable membrane 3. The height of the protrusion 2a may desirably be from 0.5 to 5 mm higher than that of the portion at which the protrusion 2a is not provided.

In Embodiments 1 to 9, the cylindrical member 1 and the support 2 may be formed of materials different from each other, but may be integrally formed together from the same material by a method such as injection molding described later.

2. Detailed Description of Each Component of Vent Plug

The following will describe the details (e.g., preferred materials) of the cylindrical member 1 and the air-permeable membrane 3 in the vent plug of the present invention.

(1) Cylindrical Member

The material of the cylindrical member 1 is not particularly limited, but the cylindrical member 1 may preferably be formed of an elastic resin, in view of its application in which the vent plug is inserted into a part of an electric device as described above. Examples of the resin may desirably include predominantly olefin elastomeric resins, such as Santoprene and Milastomer; rubber-based or rubber-substitute elastomeric resins, such as ethylene-propylene rubber (EPDM), acrylic rubber, silicon rubber, and fluoro-rubber; and those which contain polypropylene (PP). To easily insert the vent plug of the present invention into a part of an electric device, the hardness (JIS K 6253) of the cylindrical member 1 is 100 degrees or smaller, more preferably 80 degrees or smaller. To ensure the sealing properties of the cylindrical member, the hardness is 10 degrees or larger, more preferably 40 degrees or larger. The hardness of rubber is measured by the use of a durometer (available from Shimadzu Corporation, DUROMETER A).

It is desirable that the height of the protrusion 1b of the cylindrical member 1 may preferably be set to be from 5% to 200%, more preferably from 10% to 100%, and still more preferably from 15% to 50%, relative to the diameter of the though-hole 1a of the cylindrical member 1.

(2) Air-Permeable Membrane

As the constituent material of the air-permeable membrane 3, there can be used polyethylene, polypropylene, polystyrene, polyimide, or others, and it is recommended to use preferably a film formed of a fluorocarbon resin having high waterproofness, more preferably porous polytetrafluoroethylene (porous PTFE). The microscopic shape of the air-permeable membrane 3 may be a net shape, a mesh shape, or a porous shape. A porous PTFE film is highly droplet-proof, and therefore, it is suitable for applications in which air permeability is provided between the inside and outside of an electronic device, while water droplets, oil droplets, and dust are prevented from entering the electronic device.

The porous PTFE film is obtained by mixing PTFE fine powder with a molding aid to form a paste; molding the paste to form a molded product; removing the molding aid from the molded product; subsequently expanding the molded product at a high temperature and at a high speed; and if necessary, baking the expanded molded product. A uniaxially expanded porous PTFE film has nodes (folded crystals) arranged orthogonal to the expanding direction in a thin island manner, and fibrils (linear molecule bundles in which folded crystals have been unraveled and pulled out by the expanding) oriented in the expanding direction in a reed-screen manner so as to connect the nodes. This leads to a fibrous structure in which the spaces defined by fibrils and the spaces defined by fibrils and nodes are holes. A biaxially expanded porous PTFE film has fibrils extending in a radial manner, and this leads to a spider's-web-like fibrous structure in which nodes connecting fibrils are interspersed in an island manner, and there are many spaces defined by the fibrils and the nodes.

The air-permeable membrane 3 may be a uniaxially expanded porous PTFE film or a biaxially expanded porous PTFE film.

The air-permeable membrane 3 preferably has a sufficient strength to be used solely (as a single layer), but may be used in a layered manner with an air-permeable reinforcing layer which has stretch properties and can preferably endure a high temperature of 120° C., such as a nonwoven fabric or a net of woven fabric, knitted fabric, or others.

The air-permeable membrane 3 may preferably have the following physical properties: a resistance to water pressure of 1 kPa or higher, more preferably 10 kPa or higher; and an air permeability (JIS P 8117) of 1,000 seconds or lower, more preferably 100 seconds or lower.

The surfaces inside the pores of the air-permeable membrane 3 may preferably be provided with liquid repellency. When the air-permeable membrane 3 is provided with liquid repellency, it is possible to prevent various contaminants, such as body oils, machine oils, and water droplets, from penetrating into, or being held in, the pores of the air-permeable membrane 3. The contaminants reduce the collection characteristics and the air permeability of the air-permeable membrane 3, and result in impairing the functions as the air-permeable membrane. In this connection, the entire surface of the cylindrical member 1 may be provided with liquid repellency.

In the claims and the present description, it is possible to perform the method of providing liquid repellency, also by using a liquid-repellent material or adding a liquid-repellent agent. In this case, "liquid-repellent" refers to the property or the function of repelling liquid, and examples of the "liquid-repellent agent" may include "water-repellent agents", "oil-repellent agent", and "water/oil-repellent agent". The following explanation will take a water/oil-repellent polymer as an example.

As the water/oil-repellent polymer, there may be, for example, polymers each having fluorinated side chains. The water/oil-repellent polymer and a method of forming a composite of the water/oil-repellent polymer and a porous PTFE film are disclosed in the International Publication WO 94/22928 and others.

Further, the air-permeable membrane 3 can be provided with various functionalities by adding thereto liquid-repellant materials as described above, hydrophilic materials, electrically conductive materials, coloring materials, antistatic materials, antimicrobial materials, and/or other materials.

(3) Others

To join the cylindrical member 1 and the air-permeable membrane 3, it is possible to use a method of compression-bonding the air-permeable membrane 3 to the cylindrical member 1 melted as described below, and it is also possible to use a double-sided pressure-sensitive adhesive tape. These are, however, not essential elements of the present invention. The double-sided pressure-sensitive adhesive tape may be various types of tapes, such as nonwoven-fabric-backed double-sided pressure-sensitive adhesive tapes, of which core is a polyethylene nonwoven fabric, a polypropylene nonwoven fabric, a nylon nonwoven fabric, or others; PET-backed double-sided pressure-sensitive adhesive tapes; polyimide-backed double-sided pressure-sensitive adhesive tapes; nylon-backed double-sided pressure-sensitive adhesive tapes; foam (e.g., urethane foam, silicone foam, acrylic foam, polyethylene foam) -backed double-sided pressure-sensitive adhesive tapes; and backingless double-sided pressure-sensitive adhesive tapes.

3. Use Examples of Vent Plug

The vent plug of the present invention is directly or indirectly attached to, for example, a case (housing) for putting electronic components therein. Various changes, however, can be made in the shape of the cylindrical member 1 depending on the shape of the portion to which the cylindrical member 1 is attached.

Figure 10:
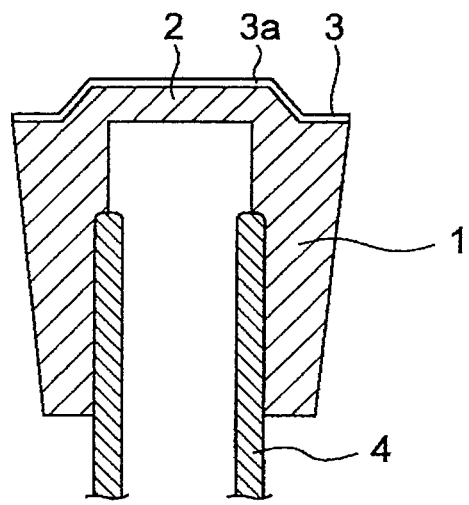
[FIG. 10] This is a view showing one use example of a vent plug of the present invention.

As shown in FIG. 10, in the case where a vent plug is attached to an end portion of a vent pipe 4, a stepped portion on which the end of the vent pipe 4 abuts may be provided inside the cylindrical member 1. Further, although not shown in FIG. 10, the shape of the cylindrical member 1 may be formed so as to fit both the inside and outside of the vent pipe 4. This increases the attachment strength of the vent plug.

Figure 11:
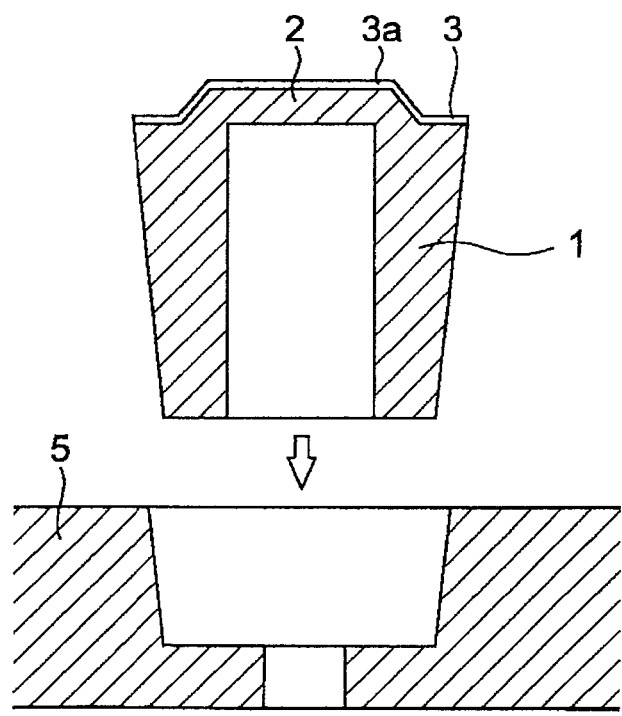
[FIG. 11] This is a view showing another use example of a vent plug of the present invention.

As shown in FIG. 11, a vent plug may be attached to a hole having a bottom, which is provided in a part of the case (housing) 5. An improvement in the fitness with the hole makes it possible to produce a vent plug with excellent shielding properties and excellent attachment strength.

4. Examples of Production Process of Vent Plug

Examples of a process applicable to the production of the vent plug according to the present invention will be described below.

(1) Injection Molding

This is a method in which a melted thermoplastic resin is pressed into a mold processed to have a prescribed hollow shape, and subsequently, the thermoplastic resin is cooled to obtain a molded product of the vent plug. The process steps are shown in the process cross-sectional views of FIGS. 12(a) to 12(c).

Figure 12:
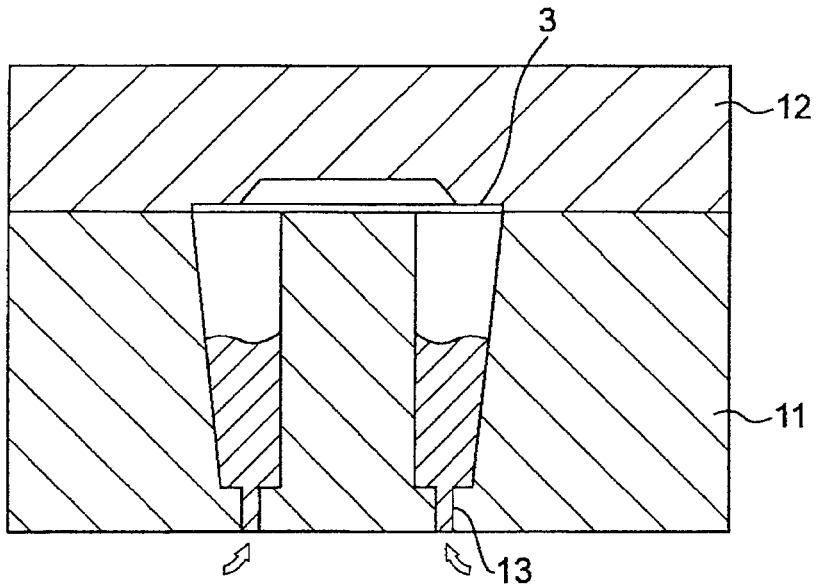
[FIG. 12] This is a series of views showing one example of the production process of a vent plug of the present invention.
Figure 12:
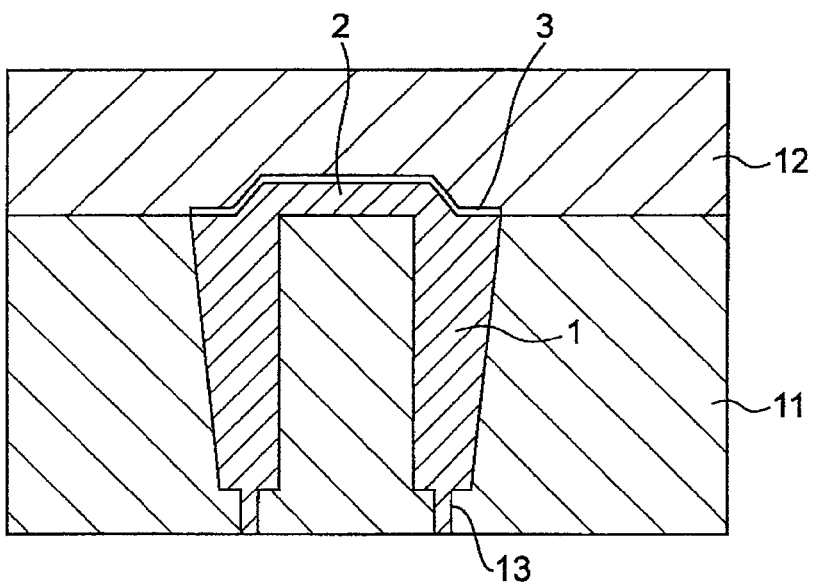
Figure 12:
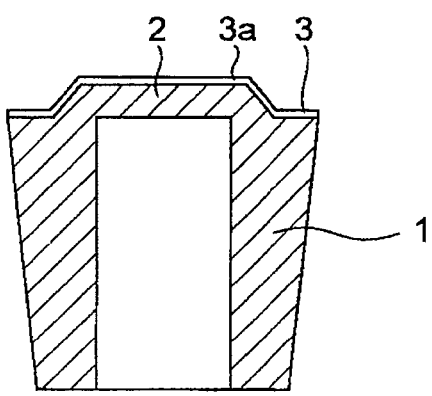

First, as shown in FIG. 12(a), a first mold 11 and a second mold 12 are placed face-to-face and brought into close contact with each other, so that a cavity having the shape of a cylindrical member 1 is formed in the molds. An air-permeable membrane 3 is sandwiched in advance between the first mold 11 and the second mold 12.

Then, as shown in FIG. 12(b), a melted thermoplastic resin is injected into the first mold 11 through an inlet 13. When the thermoplastic resin has reached the air-permeable membrane 3, the thermoplastic resin pushes up the air-permeable membrane 3 to a concave portion of the second mold 12. Thus, the air-permeable membrane 3 is formed along the shape of the thermoplastic resin. At this time, the melted resin having flowed into the concave portion of the second mold 12 forms the portion serving as the support 2.

When the melted resin is injected, the spaces of the air-permeable membrane 3 (e.g., a PTFE porous body) are impregnated with the resin by the injection pressure of the resin, and then, the resin is cured by cooling, so that the resin (i.e., the molded cylindrical member 1) and the air-permeable membrane 3 are strongly fixed to each other by an anchor effect.

Finally, as shown in FIG. 12(c), a vent plug can be obtained, in which the cylindrical member 1 and the support 2 are integrally molded and further integrally formed together with the air-permeable membrane 3, by the removal of the first mold 11 and the second mold 12.

(2) Compression Molding

The process steps are similar to those of the injection molding described above, but compression molding is a method in which a resin capable of being cured by vulcanization (e.g., a rubber-based material such as EPDM described above) is pressed by a high-pressure pressing machine into a mold processed to have a prescribed shape; and subsequently, the resin is cured by vulcanization to obtain a molded product of the vent plug. The spaces of the air-permeable membrane 3 (e.g., PTFE porous body) are impregnated with the resin by the injection pressure of the resin, and then, the resin is cured by cooling, so that a strong fixing effect can be obtained by an anchor effect.

(3) Other methods

It is also possible to, at first, mold separately the cylindrical member 1 and the support 2 to be integrally molded therewith, in advance by molding such as injection molding or compression molding; and subsequently, fix the air-permeable membrane 3 to the circumferential attachment region of the cylindrical member 1, using a welding member of a prescribed shape. For the fixing, there is also a method of reheating and melting the cylindrical member 1; impregnating space portions of the air-permeable membrane 3 (e.g., a PTFE porous body) with the melted resin; and cooling and solidifying the cylindrical member 1, whereby a vent plug is obtained in which the cylindrical member 1 and the support 2 are integrally molded and which is further integrally formed together with the air-permeable membrane 3.

Further, it is also possible to adhere the cylindrical member 1 and/or the support 2, both of which are formed of a resin, to the air-permeable membrane 3, using an adhesive, and it is also possible to fix the cylindrical member 1 and/or the support 2 to the air-permeable membrane 3 with a double-sided pressure-sensitive adhesive tape, as has already been described in detail.

In each of Embodiments 1 to 9, using a rubber compression molding machine (available from Meiki Co., Ltd.: R series, a mold clamping force of 70 tons) and metallic molds having cavities of prescribed shapes, the vent plug can be obtained by setting an air-permeable membrane at a prescribed position in the molds; then injecting an unvulcanized rubber into the molds; and vulcanizing and curing the rubber. In this connection, an EPDM, for example, can be used as the resin forming the cylindrical member 1 and/or the support 2, and an oil-repellent PTFE membrane (having a pore diameter of 1 μm, a thickness of 300 μm, and a porosity of 60% (all nominal values)), for example, can be used for the air-permeable membrane 3.

EXPLANATION OF NUMERALS

1 Cylindrical member
1a Through-hole
1b Protrusion
2 Support
2a Protrusion
3 Air-permeable membrane
3a Convex portion
4 Vent pipe
5 Case (housing)
11 First mold
12 Second mold
13 Inlet

What is claimed is:

1. A vent plug comprising: a cylindrical member having a through-hole; a support connected to the cylindrical member so as to be across the through-hole; and an air-permeable membrane having a circumferential attachment region, attached to an upper surface of the cylindrical member around the through-hole of the cylindrical member, and further having a ventilation region facing the through-hole, wherein the air-permeable member is held on the support and a convex portion of the ventilation region that contacts and follows the shape of the support is formed on the air-permeable membrane to be higher than a surrounding portion of the ventilation region.

2. The vent plug according to claim 1, wherein the cylindrical member and the support are integrally formed together from the same material.

3. The vent plug according to claim 1, wherein the support has a branched structure and is connected to three or more positions of the cylindrical member.

4. The vent plug according to claim 1, wherein the support has a cross structure and is connected to four or more positions of the cylindrical member.

5. The vent plug according to claim 1, wherein the support has a mesh structure.

6. The vent plug according to claim 1, wherein the support has an arc shape.

7. The vent plug according to claim 1, wherein the cylindrical member has a protrusion at a portion to which the air-permeable membrane is circumferentially attached.

8. The vent plug according to claim 7, wherein a top of the protrusion is at a position higher than the top of the convex portion of the air-permeable membrane.

9. The vent plug according to claim 1, wherein the support is not completely across the through-hole and interrupted.

10. The vent plug according to claim 1, wherein the support has a protrusion.

11. The vent plug according to claim 1, wherein the air-permeable membrane is a porous polytetrafluoroethylene membrane.

12. The vent plug according to claim 1, wherein the air-permeable membrane has liquid repellency.

13. The vent plug according to claim 1, wherein the convex portion contacts and follows the shape of the support on top and lateral surfaces thereof.

14. The vent plug according to claim 13, said support being formed so that a width of the support increases toward the cylindrical member.

15. The vent plug of claim 14, said support having a trapezoidal shape.

16. The vent plug of claim 1, said cylindrical member formed from an elastomeric material and configured to have a lateral surface having a tapered shape.

17. The vent plug of claim 1, said support being connected on the upper surface of and thereby positioned higher than the upper surface of the cylindrical member.

18. A vent plug comprising: a cylindrical member having a through-hole, an upper surface and at least one protrusion on the upper surface; a support connected to the cylindrical member so as to be across the through-hole; and an air-permeable membrane having a circumferential attachment region, attached to the upper surface and at least one protrusion of the cylindrical member around the through-hole of the cylindrical member, and further having a ventilation region facing the through-hole, wherein the air-permeable member is held on the support and a convex portion of the ventilation region that contacts and follows the shape of the support is formed on the air-permeable membrane to be higher than a surrounding portion of the ventilation region.

19. The vent plug of claim 18, wherein a top of the at least one protrusion is at a position higher than the top of the convex portion of the air-permeable membrane.

20. The vent plug of claim 19, wherein the convex portion contacts and follows the shape of the support on top and lateral surfaces thereof.

* * * * *